United States Patent
Lee et al.

(10) Patent No.: US 7,865,325 B2
(45) Date of Patent: Jan. 4, 2011

(54) TEST SYSTEM AND FAILURE PARSING METHOD THEREOF

(75) Inventors: Jong-Hyun Lee, Gyeonggi-do (KR); Soo-Yong Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 312 days.

(21) Appl. No.: 12/110,198

(22) Filed: Apr. 25, 2008

(65) Prior Publication Data

US 2008/0270050 A1 Oct. 30, 2008

(30) Foreign Application Priority Data

Apr. 27, 2007 (KR) .................. 10-2007-0041422

(51) Int. Cl.
*G01R 31/26* (2006.01)

(52) U.S. Cl. ..................... 702/117; 702/81; 702/59; 702/183; 702/185; 700/121; 700/110; 714/724; 365/185.09; 365/200; 365/202; 257/E21.525; 382/145

(58) Field of Classification Search ............ 702/59, 702/117, 58, 182, 183, 185; 700/121, 110, 700/73; 714/37, 48, 47; 365/185.09, 200, 365/201, 202; 257/E21.525; 382/145, 143, 382/144

See application file for complete search history.

(56) References Cited

U.S. PATENT DOCUMENTS

| | | | |
|---|---|---|---|
| 5,844,850 A * | 12/1998 | Tsutsui et al. | 365/200 |
| 6,349,240 B2 * | 2/2002 | Ogawa et al. | 700/121 |
| 6,573,743 B2 * | 6/2003 | Sato | 324/765 |
| 7,043,384 B2 * | 5/2006 | Matsushita et al. | 702/81 |
| 7,095,663 B2 | 8/2006 | Hong | |
| 7,302,091 B2 * | 11/2007 | Hamaguchi et al. | 382/145 |
| 7,392,146 B2 * | 6/2008 | Nozuyama | 702/117 |
| 7,599,817 B2 * | 10/2009 | Matsushita | 702/185 |
| 7,676,775 B2 * | 3/2010 | Chen et al. | 716/4 |
| 2002/0097064 A1 * | 7/2002 | Sato | 324/765 |
| 2004/0151362 A1 * | 8/2004 | Hamaguchi et al. | 382/145 |
| 2004/0228186 A1 * | 11/2004 | Kadota | 365/202 |
| 2005/0102591 A1 * | 5/2005 | Matsushita et al. | 714/724 |
| 2006/0281199 A1 * | 12/2006 | Matsushita | 438/14 |
| 2008/0172190 A1 * | 7/2008 | Lee | 702/59 |

FOREIGN PATENT DOCUMENTS

| | | |
|---|---|---|
| JP | 2001-023400 | 1/2001 |
| KR | 2003-0067457 | 8/2003 |
| KR | 2005-0049604 | 5/2005 |
| KR | 2005-0053252 | 6/2005 |

\* cited by examiner

*Primary Examiner*—Carol S Tsai
(74) *Attorney, Agent, or Firm*—Myers Bigel Sibley & Sajovec, P.A.

(57) ABSTRACT

A test system and a failure parsing method. The test system may comprise a cell array including defective cells formed according to various failure causes, a test apparatus configured to measure electric characteristics from the defective cells and make the measured electric characteristics numerical, and a database apparatus configured to store the numerical electric characteristics. The failure parsing method may include forming defective cells to have at least one failure cause, measuring electric characteristics of each of the defective cells, storing the measured electric characteristics of each of the defective cells in a database, and judging failure causes of a failed chip of a semiconductor wafer based on the database.

20 Claims, 4 Drawing Sheets

US 7,865,325 B2

TEST SYSTEM AND FAILURE PARSING METHOD THEREOF

CROSS-REFERENCE TO RELATED APPLICATIONS

This U.S. non-provisional patent application claims priority under 35 U.S.C. §119 of Korean Patent Application No. 10-2007-0041422 filed on Apr. 27, 2007, the entirety of which is hereby incorporated by reference.

BACKGROUND

The present invention relates to a semiconductor device, and more particularly, to failure analysis of semiconductor devices.

Large-volume semiconductor memory devices have been made depending upon advances in integration and scaledown of design rules. The same applies specifically to SRAM fabricating processes. The high integration may increase probability of making defective cells due to a short circuit or open circuit of SRAM cells, damage of SRAM cells, and the like. A conventional SRAM cell is shown in FIG. 1, including transistors T1-T6 arranged among wordline WL and bitlines BL and /BL. A procedure of developing semiconductor devices may necessitate securing stable manufacturing technology for scanning and reducing defects. For example, a failure analysis scheme has been utilized to secure stable manufacturing technology. According to the failure analysis scheme, it is possible to detect failure causes present in a semiconductor device under test and to improve the detected failure causes.

In particular, considering that methods of designing and manufacturing semiconductor devices are changed according to failure analysis results, an appropriate failure analysis scheme is very critical to developing semiconductor devices. For example, erroneous failure analysis causes delays in development due to many trials and errors. Conventional SRAM area-type failure analysis is made via EDS map testing, defect map testing, Test Element Group (TEG) testing, and the like.

In general, if transistors or interconnections in SRAM cells are defective, characteristic curves of defective SRAM cells may be different from a characteristic curve of a normal SRAM cell. That is, it is possible to analyze failure causes via characteristic curves. However, it is increasingly difficult to analyze failure causes due to advance in integration and/or complicated process technology.

Accordingly, speedy and exact failure analysis is very important to reduce delays in development and to improve time-to-market of semiconductor devices.

SUMMARY OF THE INVENTION

The present invention is directed to provide a test system and method capable of rapidly judging failure causes of semiconductor memory devices.

One aspect of the present invention is directed to a test system which comprises a cell array including defective cells formed according to various failure causes; a test apparatus configured to measure electric characteristics from the defective cells and make the measured electric characteristics numerical; and a database apparatus configured to store the numerical electric characteristics.

Another aspect of the present invention is directed to a failure parsing method which comprises forming defective cells to have various failure causes; measuring electric characteristics from the defective cells to put the measured electric characteristics into a database; and judging failure causes of a failed chip on a wafer based upon the database.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
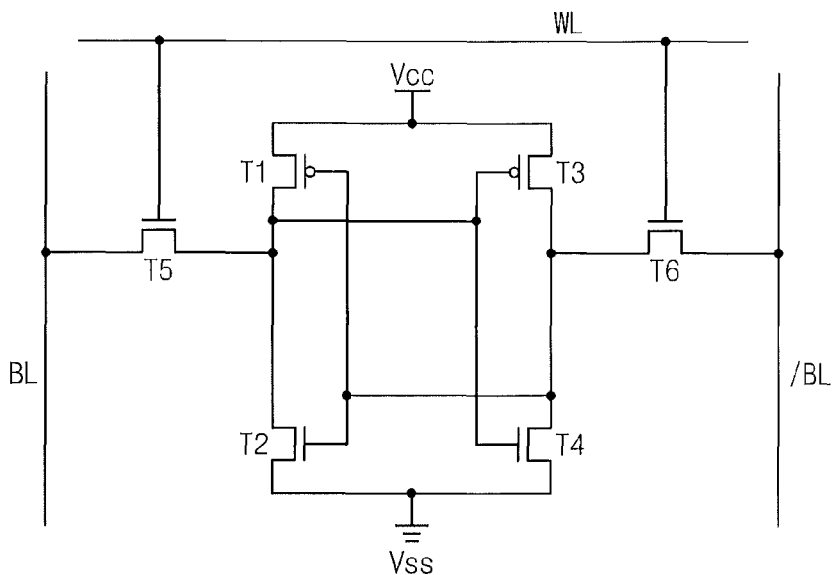
FIG. 1 is a circuit diagram showing a conventional SRAM cell.

Preferred embodiments of the present invention will be described below in more detail with reference to the accompanying drawings, showing a flash memory device as an example for illustrating structural and operational features by the invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 2:
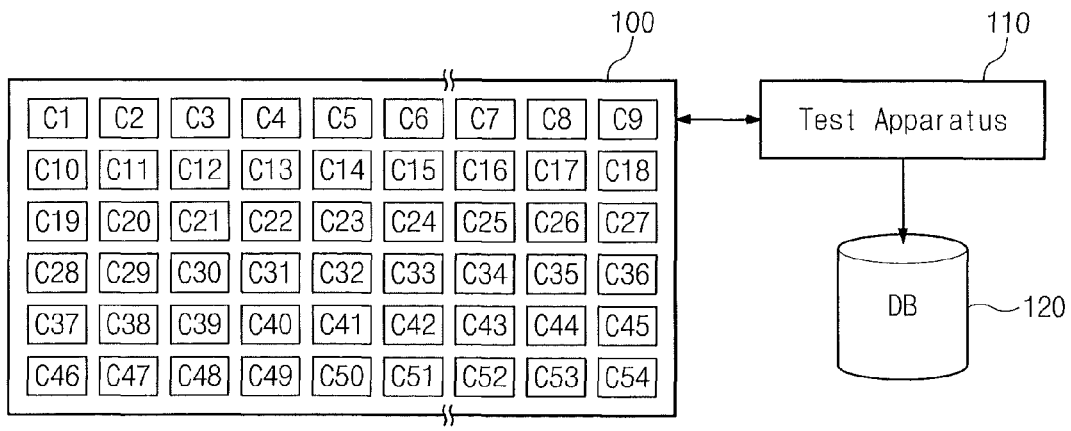
FIG. 2 is a block diagram showing a test system according to example embodiments the present invention.

FIG. 2 is a block diagram showing a test system according to example embodiments of the present invention. Referring to FIG. 2, a test system according to example embodiments of the present invention may include an SRAM die for test 100, which has defective cells C1~C54 arranged in rows and columns. The defective cells C1~C54 may be artificially manufactured to have various failure causes. The failure causes may be generated for various manufacturing semiconductor devices, such as semiconductor memory devices. For example, an SRAM cell C1 may be configured to have constituent element and/or interconnection defects. The interconnection defects may include short-circuit or open-circuit defects. An SRAM cell may have a resistive value that is varied according to the open-circuit grade or position.

In FIG. 2, SRAM cells in the same row/column may be formed to have substantially the same failure cause. In this case, for example, SRAM cells in the same row/column may be formed to have different and increasing/decreasing resistive values from each other. Open-circuit positions may be determined to be placed at various points where open-circuit defects are characteristically made during a fabricating process.

Further, an SRAM cell may be formed to have an artificially manufactured short-circuit defect between its gate and drain. As described above, SRAM cells may be formed to have short-circuit defects at various points. In addition to the above-described failure causes, SRAM cells may be formed to have other failure causes. For example, various failure causes generated at a fabricating process may be modeled to analyze defect positions and types. It is possible to form defective cells based upon the analyzed defect positions and types.

Further, defective cells may be fabricated using various design rules (e.g., 130 nm, 90 nm, 60 nm, etc.). Alternatively, SRAM dies for test may be fabricated using various design rules, respectively. In this case, each SRAM die may include defective cells so as to have the same failure causes as described above. This is because defective cells have different electric characteristics under different design rules although they are fabricated to have the same failure causes. The SRAM die for test 100 having the artificially manufactured defects may be formed from a semiconductor wafer different than a semiconductor wafer to be later tested. Alternatively, the SRAM die for test 100 having the artificially manufactured defects may be formed from a same semiconductor wafer to be later tested.

Continuing to refer to FIG. 2, the test system may further comprise a test apparatus 110 and a database apparatus 120. The test apparatus 110 may measure electrical characteristics of the respective defective cells in the SRAM die for test 100. For example, the test apparatus 110 may measure current-voltage analog characteristics of the respective defective cells in the SRAM die for test 100. The measured electric characteristics may become numerical.

The database apparatus 120 may store the electrical characteristics of the defective cells that are measured by the test apparatus 110 and expressed numerically. For example, the database apparatus 120 may include a memory device. Electric characteristics may be classified in a design rule unit, a defect position unit, and a defect grade unit, and then the classified electric characteristics may be stored in the memory device of the database apparatus 120. Electric characteristics of defective cells stored in the database apparatus 120 may be used as a database for rapidly parsing failure causes at a fabricating level.

As understood from the above description, the present test system may include an SRAM die for test where defective cells are artificially formed to have various failure causes. Electric characteristics of the defective cells are measured via a test apparatus, and the measured electric characteristics are numerically stored in a database apparatus.

Figure 3:
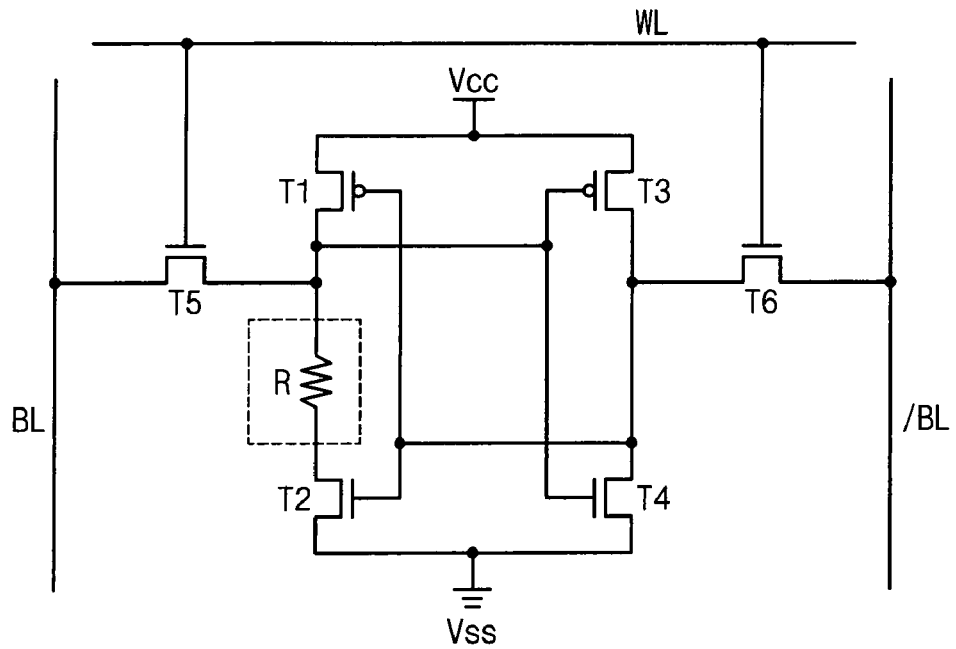
FIGS. 3 and 4 are circuit diagrams showing defective cells according to some example embodiments.
Figure 4:
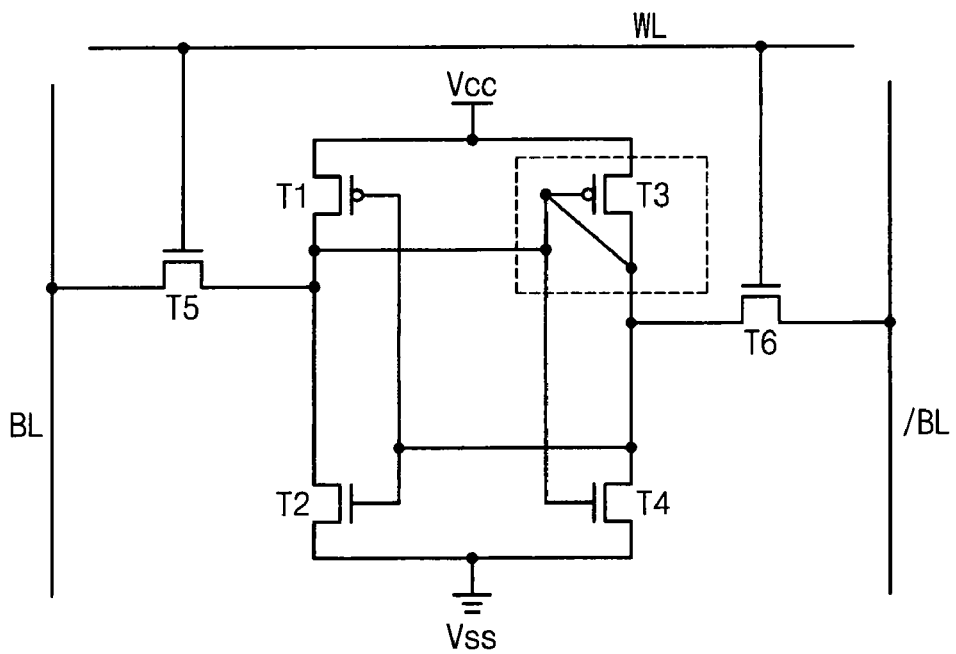

FIGS. 3 and 4 are circuit diagrams showing defective cells according to example embodiments of the present invention. First, referring to FIG. 3, an SRAM cell may be formed to have an open-circuit defect, which is made between a drain of a transistor T1 and a drain of a transistor T2. The open-circuit defect may be established by inserting a resistor R between the drains of the transistors T1 and T2. Persons with skill in the art will recognize that the position of the open-circuit defect is not limited to this position, but could be positioned at other locations within the SRAM cell. It is possible to control open-circuit grade via variation of the resistor R.

As illustrated in FIG. 4, an SRAM cell may be formed to have a short-circuit defect, which is made between a gate and a drain of a transistor T3. An SRAM cell with a short-circuit defect may have an electric characteristic different from that of a normal SRAM cell. Persons with skill in the art will recognize that the short-circuit defect can be placed at other locations within the SRAM cell.

Although short-circuit and open-circuit defects are described in FIGS. 3 and 4, as set forth above, it is possible to form SRAM cells with a plurality of failure causes. Electric characteristics of the defective cells may be measured via a test apparatus, and the measured electric characteristics may be numerically stored in the database apparatus 120.

Figure 5:
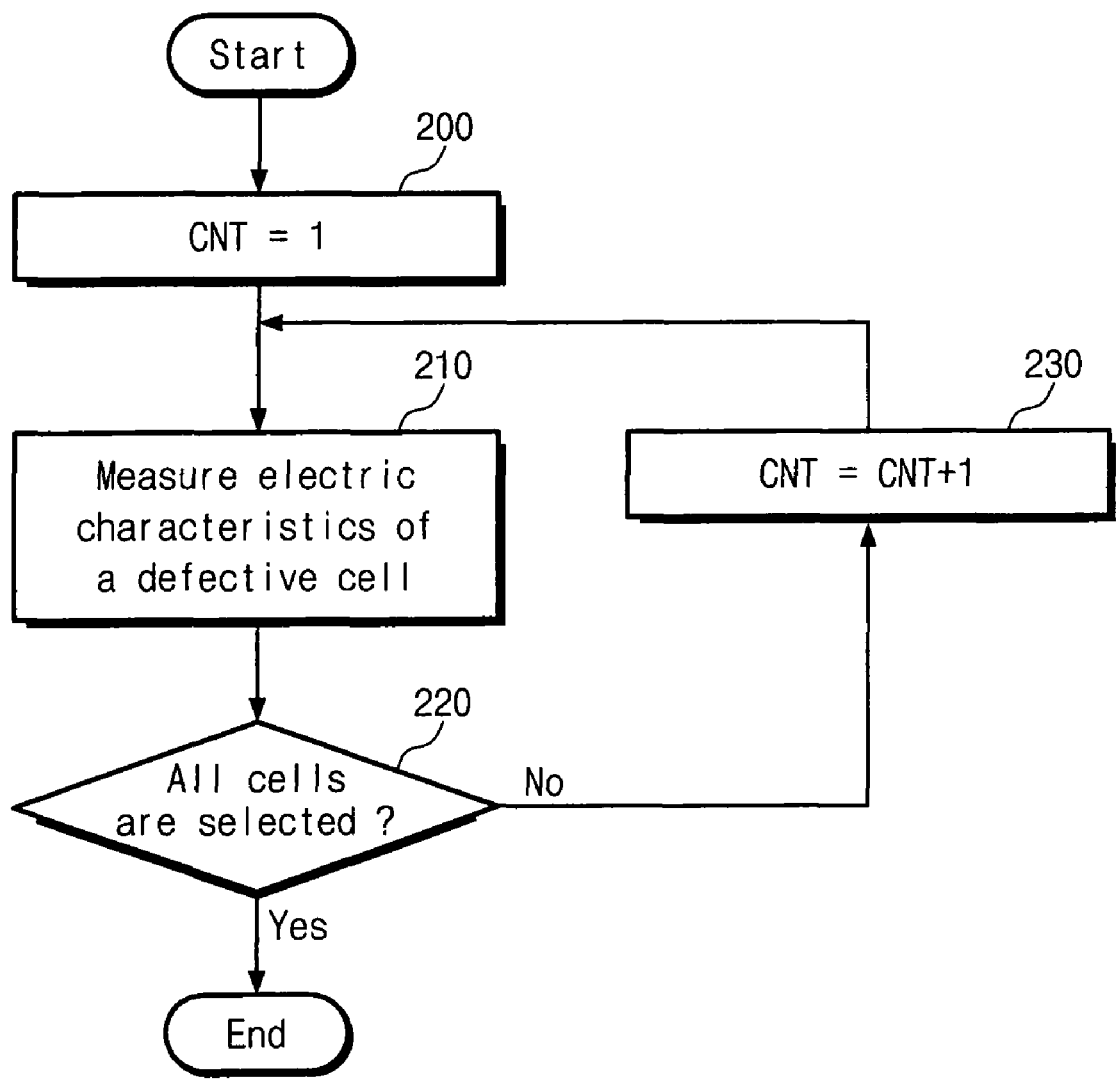
FIG. 5 is a flow diagram for describing a test operation according to example embodiments of the present invention.

FIG. 5 is a flow diagram for describing a test operation according to example embodiments the present invention. In accordance with the present invention, electric characteristics of defect cells may be measured, and then the measured electric characteristics may be put into the database 120. Hereinafter, a test operation will be more fully described with reference to accompanying drawings.

When a test operation commences to measure electric characteristics of defective cells, in block 200, a count value CNT may be reset to '1'. The count value CNT may be used to select defective cells. In block 210, a test apparatus 110 measures electric characteristics of a defective cell corresponding to the count value CNT, and the measured electric characteristics may be numerically stored in the database apparatus 120. In block 220, the test apparatus 110 may check whether all defective cells are selected. If at least one of the defective cells is not selected, the procedure proceeds to block 230, in which the count value CNT is counted up or incremented by a natural number, such as '1'. The above-described procedures are repeated until all defective cells are selected and measured. If all defective cells are selected, the test operation is ended.

As described above, it is possible to measure electric characteristics of the defective cells via the test apparatus 110 and to numerically store measured electric characteristics in the database apparatus 120. The test operation may be carried out in accordance with respective design rules.

Figure 6:
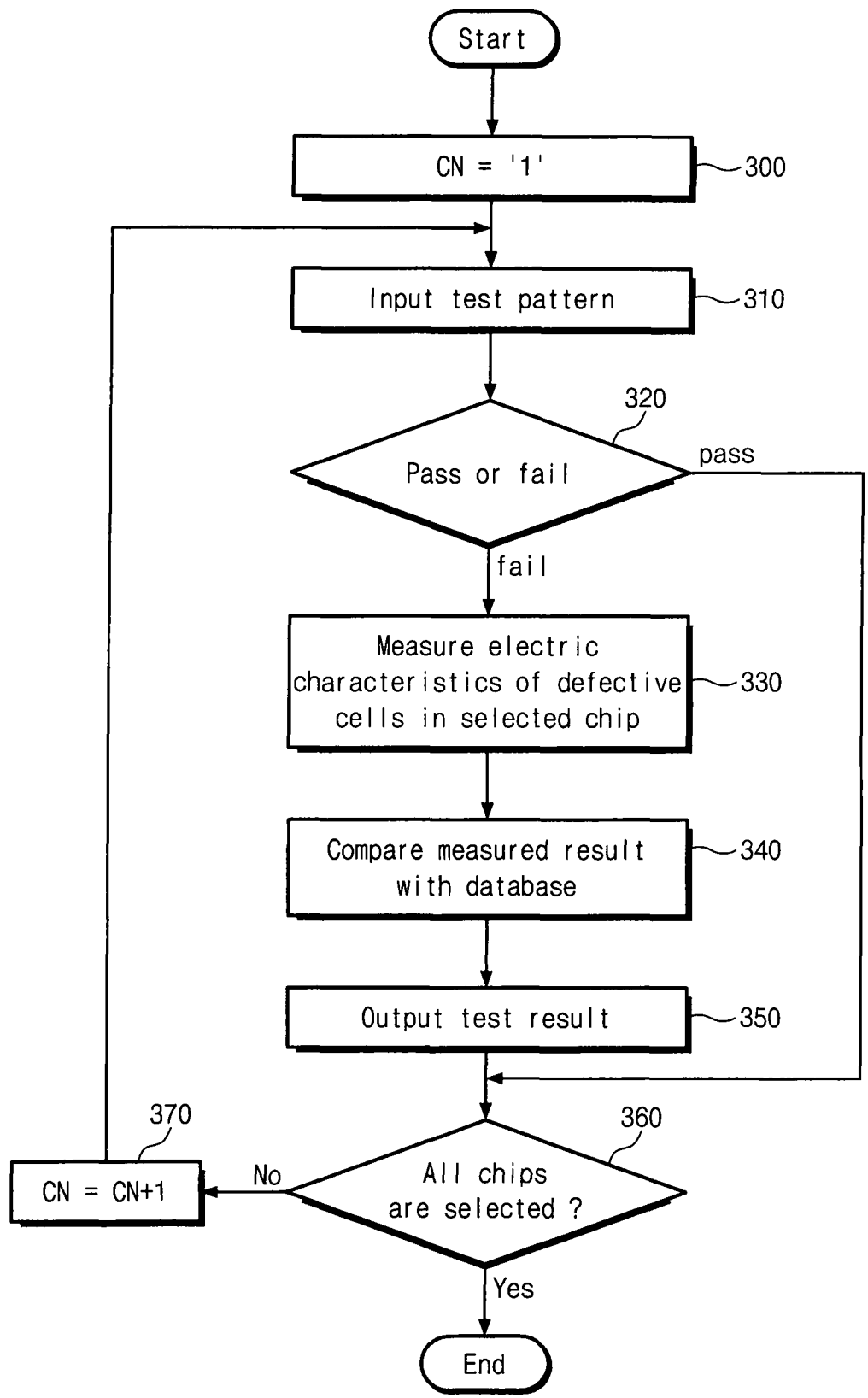
FIG. 6 is a flow diagram for describing a test operation with respect to dies according to example embodiments the present invention.

FIG. 6 is a flow diagram for describing a test operation with respect to dies according to example embodiments of the present invention. Once a test operation commences, in block 300, a value CN indicating a count number, e.g., chip number (or, a die number), may be reset to '1'. In block 310, a test apparatus 110 selects a chip (or, die) on a wafer corresponding to the value CN, and inputs a test pattern into the selected chip. In block 320, the test apparatus 110 reads out the input test pattern from the selected chip and checks whether the selected chip is defective. If the selected chip is not defective, the procedure proceeds to block 360. If the selected chip is determined to be defective, the procedure proceeds to block 330, in which electric characteristics are measured with respect to defective cells in the selected chip. In the next block 340, the test apparatus 110 may compare the measured electric characteristics of the selected chip with electric characteristics previously stored in a database apparatus 120. In block 350, the test apparatus 110 may output a comparison result. Alternatively, although not illustrated in FIG. 6, it is possible to store the comparison result in the test apparatus 110 together with a number of the selected chip.

In the next block 360, the test apparatus 110 may check whether all chips (or dies) are selected. If at least one of chips (or dies) on a wafer is not selected, in block 370, the value CN indicating a chip/die number is counted up or incremented by a natural number, such as '1', and the procedure returns to block 310. If all chips/dies are selected, the test operation is ended.

As understood from the above description, when a defective chip/die is detected, electric characteristics of defective cells in the detected chip are measured, and the measured electric characteristics are compared with electric characteristics previously stored a database in the database apparatus 120. Accordingly, it is possible to find failure causes of defective cells in the detected chip/die exactly and rapidly according to a comparison result. That is, electric characteristics in the database apparatus 120 provide data used to parse failure causes. As a result, failure causes, failure patterns, and failure positions may be rapidly parsed by searching matching electric characteristics of a defective chip in the database apparatus 120.

Additionally, defective cells with artificial formed failure causes can be placed in a predefined block of each chip/die on a wafer. Alternatively, such defective cells can be formed in a Test Element Group (TEG) manner. In this case, electric characteristics are measured from artificially formed defective cells in each wafer, and each chip on a wafer is tested using the measured electric characteristics of the wafers.

According to some example embodiments, a test system is provided, comprising: a cell array including defective cells formed according to various failure causes; a test apparatus configured to measure electric characteristics from the defective cells and make the measured electric characteristics numerical; and a database apparatus configured to store the numerical electric characteristics. The defective cells may be formed of an SRAM cell. The cell array may be formed at a predefined block of at least one chip of a wafer. The cell array may be formed on a wafer in a TEG manner. The data previously stored in the database apparatus may be used to test each chip on a wafer.

Although the present invention is described using SRAM cells, persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device failure parsing method, comprising:
   forming a plurality of defective cells to have at least one failure cause;
   measuring electric characteristics of each of the plurality of defective cells;
   storing the measured electric characteristics of each of the plurality of defective cells in a database; and
   judging failure causes of a failed chip of a semiconductor wafer based on the database, the judging comprising:
   (a) resetting a chip count number;
   (b) selecting a chip from the semiconductor wafer corresponding to the chip count number;
   (c) inputting a test pattern into the selected chip;
   (d) reading the input test pattern from the selected chip;
   (e) checking whether the selected chip is defective;
   (f) when the selected chip is judged to be defective, comparing electric characteristics of the selected chip with the measured electric characteristics stored in the database to judge failure causes of the selected chip;
   (g) outputting a comparison result responsive to the selecting and the comparing;
   (h) incrementing the chip count number; and
   (i) repeating the steps (b) to (h) until all chips on the wafer have been selected.

2. The failure parsing method of claim 1, wherein the semiconductor wafer comprises a first semiconductor wafer, and wherein forming the plurality of defective cells includes forming the defective cells at a predefined block of at least one chip on a second semiconductor wafer different from the first semiconductor wafer.

3. The failure parsing method of claim 1, wherein forming the plurality of defective cells includes forming the defective cells using a Test Element Group (TEG).

4. The failure parsing method of claim 1, wherein forming the plurality of defective cells includes forming an open-circuit defect using a variable resistive value.

5. The failure parsing method of claim 1, wherein forming the plurality of defective cells includes forming a short-circuit defect.

6. The failure parsing method of claim 1, wherein resetting the chip count number includes setting the chip count number to 1, and wherein incrementing the chip count number includes incrementing the chip count number by a natural number.

7. The failure parsing method of claim 6, wherein the natural number is '1'.

8. The failure parsing method of claim 1, further comprising storing the comparison result together with the count number associated with the selected chip.

9. A semiconductor device failure parsing method, comprising:
   selecting at least one failure cause to be formed as part of a plurality of defective cells;
   forming the plurality of defective cells to have the at least one failure cause;
   measuring electric characteristics of each of the plurality of defective cells;
   storing the measured electric characteristics of each of the plurality of defective cells in a database; and
   judging failure causes of a failed chip of a semiconductor wafer based on the database.

10. The failure parsing method of claim 9, wherein judging the failure causes of a failed chip of a semiconductor wafer based on the database comprises:(a) selecting a chip on a wafer;(b) checking whether the selected chip is defective;(c) when the selected chip is judged to be defective, comparing electric characteristics of the selected chip with the measured electric characteristics stored in the database to judge failure causes of the selected chip; and(d) repeating the steps (a) to (c) until all chips on the wafer are selected.

11. The failure parsing method of claim 10, wherein the semiconductor wafer comprises a first semiconductor wafer, and wherein forming the plurality of defective cells includes forming the defective cells at a predefined block of at least one chip on a second semiconductor wafer different from the first semiconductor wafer.

12. The failure parsing method of claim 10, wherein forming the plurality of defective cells includes forming the defective cells in a Test Element Group (TEG) manner.

13. The failure parsing method of claim 10, wherein forming the plurality of defective cells includes forming an open-circuit defect using a variable resistive value.

14. The failure parsing method of claim 10, wherein forming the plurality of defective cells includes forming a short-circuit defect.

15. The failure parsing method of claim 10, further comprising storing a comparison result together with a count number associated with the selected chip.

16. A semiconductor device failure parsing method, comprising:
   forming a plurality of defective cells at a predefined block of at least one chip to have at least one failure cause;
   measuring electric characteristics of each of the plurality of defective cells;
   storing the measured electric characteristics of each of the plurality of defective cells in a database; and judging failure causes of a failed chip of a semiconductor wafer based on the database, the judging comprising:

(a) resetting a chip count number to '1';

(b) selecting a chip from the semiconductor wafer corresponding to the chip count number;

(c) inputting a test pattern into the selected chip;

(d) reading the input test pattern from the selected chip;

(e) checking whether the selected chip is defective;

(f) when the selected chip is judged to be defective, comparing electric characteristics of the selected chip with the measured electric characteristics stored in the database to judge failure causes of the selected chip;

(g) outputting a comparison result responsive to the selecting and the comparing;

(h) incrementing the chip count number by '1'; and (i) repeating the steps (b) to (h) until all chips on the wafer have been selected.

17. The failure parsing method of claim 16, wherein forming the plurality of defective cells includes forming the defective cells using a Test Element Group (TEG).

18. The failure parsing method of claim 16, wherein forming the plurality of defective cells includes forming an open-circuit defect using a variable resistive value.

19. The failure parsing method of claim 16, wherein forming the plurality of defective cells includes forming a short-circuit defect.

20. The failure parsing method of claim 16, further comprising storing the comparison result together with the count number associated with the selected chip.

* * * * *